United States Patent [19]

Takahashi

[11] 4,388,034
[45] Jun. 14, 1983

[54] PROCESSING APPARATUS COMPRISING A CASSETTE MEMBER TEMPORARILY SWINGABLE TO VERTICALLY HOLD A PLURALITY OF SUBSTRATES

[75] Inventor: Nobuyuki Takahashi, Fuchu, Japan

[73] Assignee: Anelva Corporation, Tokyo, Japan

[21] Appl. No.: 287,924

[22] Filed: Jul. 29, 1981

[30] Foreign Application Priority Data

Jul. 30, 1980 [JP] Japan .................................. 55-104532

[51] Int. Cl.³ .................................................. C23C 13/08
[52] U.S. Cl. .................................... 414/331; 414/217; 414/754; 204/298; 118/729
[58] Field of Search ............. 118/729, 731, 733, 719, 118/500; 204/298; 414/424, 754, 217, 331; 269/903, 24; 211/41; 312/306, 312

[56] References Cited

U.S. PATENT DOCUMENTS

| | | | |
|---|---|---|---|
| 3,404,661 | 10/1966 | Mathias et al. | 118/719 |
| 3,584,847 | 6/1971 | Hammond, Jr. et al. | 118/729 X |
| 4,047,624 | 9/1977 | Dorenbos | 118/729 X |
| 4,113,082 | 9/1978 | Timin | 118/729 X |
| 4,261,808 | 4/1981 | Walter | 118/729 X |

*Primary Examiner*—John D. Smith
*Assistant Examiner*—Bernard F. Plantz
*Attorney, Agent, or Firm*—Laff, Whitesel, Conte & Saret

[57] ABSTRACT

In a processing apparatus comprising successively arranged inlet, processing, and outlet chambers, a cassette member for holding a plurality of substrates in either or each of the inlet and the outlet chambers is reversibly moved between home and temporary positions at which each substrate is kept substantially horizontal and vertical, respectively.

5 Claims, 4 Drawing Figures

PROCESSING APPARATUS COMPRISING A CASSETTE MEMBER TEMPORARILY SWINGABLE TO VERTICALLY HOLD A PLURALITY OF SUBSTRATES

BACKGROUND OF THE INVENTION

This invention relates to an apparatus for successively processing a plurality of sheet-like substrates by sputtering, vapor evaporation, ion implantation, or the like processing procedure and, in particular, to a processing apparatus comprising a couple of cassette members for holding the substrates.

As will later be described with reference to one of several figures of the accompanying drawing, a conventional processing apparatus comprises a processing chamber for actually processing each of sheet-like substrates in a processing hollow space defined by the processing chamber. Each of the substrates is transferred from an inlet chamber to an outlet chamber through the processing chamber before and after processed in the processing hollow space. A first cassette member is accommodated in the inlet chamber so as to hold a stack of unprocessed substrates. A second cassette member is accommodated in the outlet chamber so as to hold a stack of processed substrates. The substrates may be those for use in manufacturing semiconductor integrated circuits.

A pressure in the inlet chamber should be changed from the atmospheric pressure to a reduced pressure at the beginning of processing procedure with the unprocessed substrates held in the first cassette member while a pressure in the outlet chamber should be changed from a low pressure to the atmospheric pressure at the completion of the processing procedure with the processed substrate kept in the second cassette member. Therefore, air flow takes place from the inlet chamber and out of the outlet chamber at the beginning and the completion of the processing procedure with the substrates placed in the respective chambers.

The air flow sprinkles dust in the inlet and the outlet chambers. Such dust is liable to attach or deposit onto the unprocessed and the processed substrates to bring about pin holes in a semiconductor integrated circuit manufactured by the use of the processing apparatus.

Deposition of dust is inevitable with the conventional processing apparatus comprising the cassette members, as will later be described. In addition, each of substrates is placed for a long time in either the inlet chamber or the outlet chamber until all substrates are processed in the processing apparatus. Possibility of the deposition of dust is enhanced more and more.

SUMMARY OF THE INVENTION

It is an object of this invention to provide a processing apparatus comprising a couple of cassette members, wherein deposition of dust on substrates before and/or after processing is avoided to the utmost to form an excellent layer on each of substrates.

A processing apparatus to which this invention is applicable comprises a processing chamber defining a processing hollow space, means coupled to the processing hollow space for processing a sheet-like unprocessed substrate to provide a processed substrate, an inlet chamber defining an inlet hollow space, a first cassette member for holding a stack of unprocessed substrates in the inlet hollow space with each unprocessed substrate kept substantially horizontal, means for transferring one substrate from said stack at a time into the processing chamber, an outlet chamber defining an outlet hollow space, means for transferring the processed substrate from the processing hollow space into the outlet hollow space, and a second cassette member for receiving the transferred substrate in the outlet hollow space as a stack of processed substrates with each processed substrate kept substantially parallel. According to this invention, a processing apparatus comprises moving means coupled at least to a selected one of the first and the second cassette members for reversibly moving the selected cassette member between a home position and a temporary position. The selected cassette member holds the substrates with each substrate kept substantially horizontal and vertical when moved to the home and the temporary positions, respectively.

DESCRIPTION OF THE PREFERRED EMBODIMENTS

Figure 1:
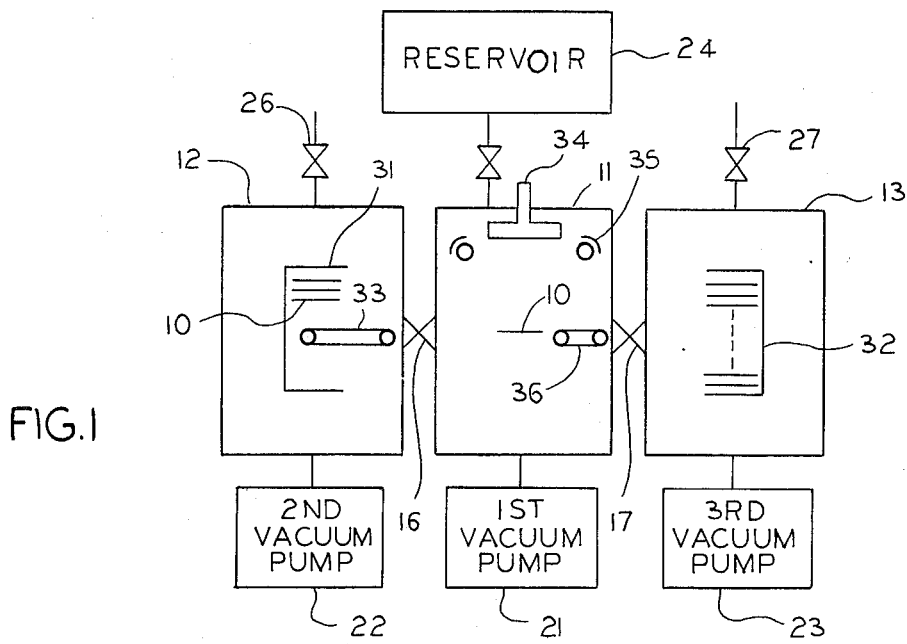
FIG. 1 shows a schematic side view of a processing apparatus to which the instant invention is applicable.

Referring to FIG. 1, a processing apparatus is for successively processing sheet-like substrates 10 by sputtering to form a layer thereon. The apparatus comprises a processing chamber 11 defining a processing hollow space, an inlet chamber 12 defining an inlet hollow space, and an outlet chamber 13 defining an outlet hollow space. The processing chamber 11 is coupled to the inlet and the outlet chambers 12 and 13 through first and second gating valves 16 and 17, respectively, each of which is known in the art. The pressure in the processing, the inlet, and the outlet chambers 11, 12, and 13 can be individually controlled by controlling, namely, opening or closing the first and the second gating valves 16 and 17. For this purpose, first, second, and third vacuum pumps 21, 22, and 23 are coupled to the processing, inlet, and outlet chambers 11, 12, and 13, respectively. The processing chamber 11 is coupled through a valve (unnumbered) to a reservoir 24 of argon or the like while the inlet and the outlet chambers 12 and 13, to first and second valves 26 and 27 for leading air into the inlet and outlet chambers 12 and 13.

A first cassette member 31 is placed in the inlet hollow space to hold a stack of the substrates 10 which are unprocessed. The number of the substrates 10 held in the first cassette member 31 is, for example, 25. As shown in FIG. 1, each of the substrates 10 is kept substantially horizontal. Likewise, a second cassette member 32 is placed in the outlet hollow space to hold a plurality of processed substrates horizontal. In a conventional processing apparatus, each of the first and the second cassette members 31 and 32 is vertically and reversibly movable by the use of a known member (not shown). At the beginning of processing procedure, the first cassette member 31 is located in the inlet chamber 12 with the unprocessed substrates 10 kept thereby while the second cassette member 32 is placed in the outlet chamber 13 without any processed substrates. Under the circumstances, the processing, the inlet, and the outlet chambers 11, 12, and 13 are individually evacuated by the use of the first through third vacuum pumps 21, 22, and 23, respectively, with the first and the second gating valves 16 and 17 closed. Thereafter, the processing chamber 11 is filled with argon gas to a predetermined pressure of, for example, $10^{-3}$ Torr. On the other hand, the inlet and the outlet hollow spaces are kept at a pressure between $10^{-6}$ and $10^{-7}$ Torr.

Next, a transferring system 33, known in the art, is energized to transfer one of the substrates 10 at a time from the stack in the first cassette member 31 into the processing chamber 11 through the first gating valve 16. In the processing chamber 11, the transferred substrate 10 is processed by the use of a sputter electrode 34, namely, target electrode, to form a layer thereon and/or by the use of a heater 35 to heat the transferred substrate to a preselected temperature. At any rate, the processing chamber 11 provides a processed substrate.

Subsequently, the processed substrate is transferred from the processing hollow space into the outlet hollow space through the second gating valve 17 by the use of a transferring system symbolized at 36. In the outlet chamber 13, the processed substrate is received by the second cassette member 32 through a similar transferring system (not shown).

The above-mentioned procedure is successively carried out. When all of the substrates 10 in the first cassette member 31 are processed and, thereafter, accommodated as the stack of the processed substrates in the second cassette member 32, the second valve 27 is opened to introduce air into the outlet hollow space, with the second gating valve 17 closed.

With the conventional processing apparatus, dust is liable to deposite onto the unprocessed and the processed substrates when air flow takes place in the inlet and the outlet chambers 12 and 13, as described in the preamble of the instant specification.

Figure 2:
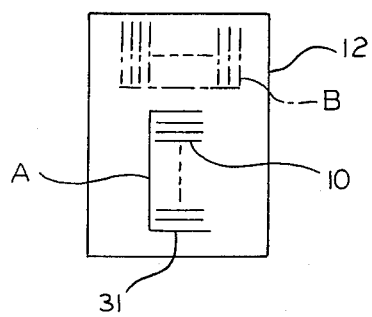
FIG. 2 diagrammatically shows a side view for describing operation of a cassette member used in a processing apparatus according to this invention.

Referring to FIG. 2, the inlet chamber 12 is schematically depicted for use in describing a processing apparatus according to the present invention. The first cassette member 31 is reversibly movable between a home position A of the type illustrated with reference to FIG. 1 and a temporary position B where the cassette member 31 holds the unprocessed substrates 10 vertical. Before evacuation by the second vacuum pump 22, the cassette member 31 with the unprocessed substrates 10 is moved to the temporary position B. After the pressure in the inlet chamber 12 is reduced below $10^{-2}$ Torr, the cassette member 31 is returned to the home position A in preparation for the processing procedure described above.

The second cassette member 32 (FIG. 1) is also reversibly movable between similar home and temporary positions. The processed substrates are successively received in the second cassette member 32 as described, with the second cassette member 32 kept in the home position. After all unprocessed substrates 10 placed in the first cassette member 31 are eventually received by the second cassette member 32, the latter cassette member 32 is moved to the temporary position. Air is subsequently led into the outlet chamber 13.

It has been confirmed by Applicant that the dust scarcely deposits on the unprocessed substrates 10 when the inlet hollow space is evacuated with the first cassette member 31 placed in the temporary position B. This applies to the processed substrates received in the second cassette member 32. It has also been confirmed that the number of undesired pin holes in semiconductor integrated circuits manufactured by a processing apparatus of the type described, descreases to a considerable extent even with only one of the first and the second cassette members 31 and 32 moved to the temporary position during evacuation of the inlet hollow space or introduction of air into the outlet hollow space.

Figure 3:
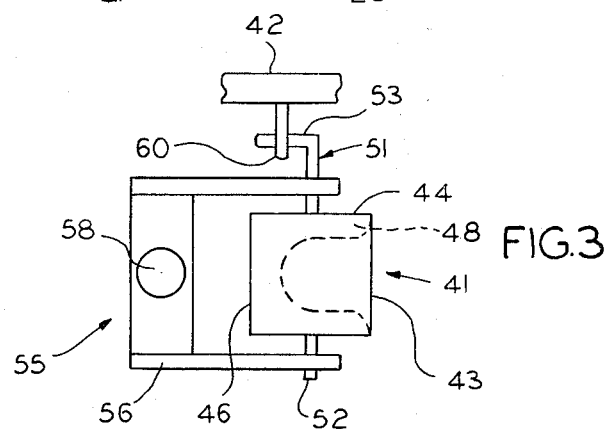
FIG. 3 shows a top view of a moving system and a cassette member both of which are used in a processing apparatus according to a preferred embodiment of this invention.
Figure 4:
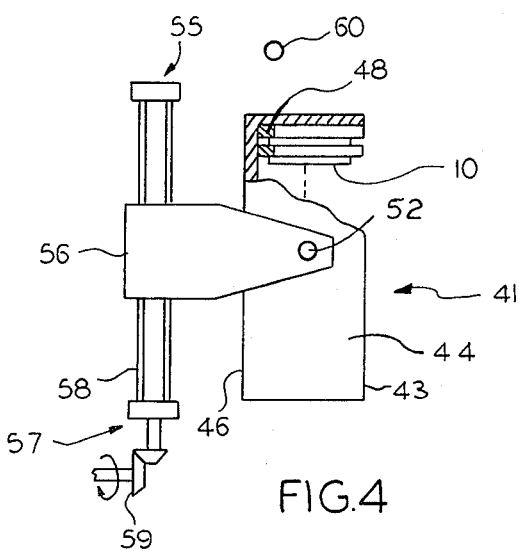
FIG. 4 schematically shows a side view of the moving system and the cassette member illustrated in FIG. 3, with a portion cut away.

Referring to FIGS. 3 and 4, a processing apparatus according to a preferred embodiment of this invention comprises a cassette member 41 in a selected one of the inlet and the outlet chambers 12 and 13. Herein, the selected chamber will simply be called chamber and designated by 42.

More particularly, the cassette member 41 comprises a cassette 43 for holding a stack of substrates 10 (the reference numeral for the unprocessed substrates being used), as is the case with the first or the second cassette member 31 or 32. As well-known in the art, the cassette 43 comprises a pair of side surfaces 44 opposite to each other, an intermediate surface 46 between the side surfaces 44, and a plurality of spaced partitions 48 connecting the side and the intermediate surfaces 44 and 46. Each of the partitions 48 has an arcuate surface defining a hollow indent as shown by a broken line in FIG. 3. Each of the substrates 10 is loosely interposed between two adjacent partitions. The arcuate surfaces are for allowing the transferring system, such as 33, to enter the cassette 43 and to receive one of the substrates 10.

The illustrated cassette 43 is held at a home position to keep each of the substrates 10 substantially horizontal, as described with reference to FIGS. 1 and 2. The cassette 43 has a specific point not lower than its center of gravity with or without the substrates 10.

In FIGS. 3 and 4, the cassette member 41 further comprises first and second rod members 51 and 52 fixed to the side surfaces 44 above the specific point when the cassette member 41 is moved to the home position. The first rod member 51 comprises a horizontal rod having first and second ends and fixed at the first end to the cassette 43 and a rod 53 extended perpendicularly from the second end in a horizontal plane when the cassette member 41 is put in the home position. The rod is horizontally aligned with the second rod member 52. As a result, the first and the second rod members 51 and 52 are substantially aligned.

Further referring to FIGS. 3 and 4, the cassette member 41 is coupled to a moving system 55 for reversibly moving the cassette member 41 between the home position and the temporary position illustrated in FIG. 2. At the temporary position, the substrates 10 are kept substantially vertical in the cassette member 41, as shown in FIG. 2.

The moving system 55 comprises a holding or frame member 56 for rotatably holding the rod of the first rod member 51 and the second rod member 52. In the moving system 55, a guide member 57 is for guiding the frame member 56 so as to vertically move the frame member 56 and comprises a threaded post 58 vertically extended and a rotating member 59 symbolized by a pair of bevel gears and a pair of driving axles for rotating the threaded post 58. One of the driving axes is extended outside of the chamber 42 to reversibly rotate the threaded post 58 by a motor (not shown). Coupled to the threaded post 58, the frame member 56 has a threaded inside surface engaged with the threaded post 58, as readily understood from FIG. 4. Thus, the first and the second rod members 51 and 52 are reversibly and vertically driven by a combination of the frame and the guide members 56 and 57.

The moving system 55 further comprises a limitation bar 60 horizontally protruded so that the first rod member 51, or more specifically, the rod 53 is urged against the limitation bar 60 while driven upwards by the combination of the frame and the guide members 56 and 57. When the threaded post 58 continues to rotate, with the rod 53 brought into contact with the limitation bar 60, the cassette member 41 is gradually swung or rotated. The rotation is stopped when the rod 53 is rotated by 90° from the horizontal plane. Under the circumstances, the cassette member 41 is put into the temporary position, as shown by B in FIG. 2.

On the other hand, when the first rod member 51 is driven downwards out of contact with the limitation bar 60 by reverse rotation of the threaded post 58, the cassette member 41 is put out of the temporary position into the home position by the torque provided by the misalignment of the center of gravity with the substantially aligned rod members 51 and 52.

As mentioned above, rotation of the cassette member 41 is carried out as a result of the vertical movement of the cassette member 41. The vertical movement may be used to transfer one of the substrates at a time to the transferring system.

According to the preferred embodiment, each of the substrates is vertically located by rotation of the cassette member when air flow takes place in the chamber 42. Therefore, dust is scarcely deposited onto the substrates even when sprinkled in the chamber due to the air flow. As a consequence, it is possible with the processing apparatus to form an excellent layer without pin holes.

While this invention has thus far been described in conjunction with a preferred embodiment thereof, it will readily be possible for those skilled in the art to put this invention into practice in various manners. For example, the moving member may be attached to each of the first and the second cassette members. This invention is applicable to an apparatus for vapor evaporation, ion implantation, or the like procedure.

What is claimed is:

1. A processing apparatus comprising a processing chamber defining a processing hollow space, means coupled to said processing hollow space for processing a sheet-like unprocessed substrate to provide a processed substrate, an inlet chamber defining an inlet hollow space, a first cassette member for holding a stack of unprocessed substrates in said inlet hollow space with each unprocessed substrate kept substantially parallel, means for transferring one substrate from said stack at a time into said processing chamber, an outlet chamber defining an outlet hollow space, means for transferring the processed substrate from said processing hollow space into said outlet hollow space, and a second cassette member for receiving the transferred substrate in said outlet hollow space as a stack of processed substrates with each processed substrate kept substantially parallel, wherein the improvement comprises moving means coupled at least to a selected one of said first and said second cassette member for reversibly moving the selected cassette member between a home position and a temporary position, said selected cassette member holding the substrates with each substrate kept substantially horizontal and vertical when moved to said home and said temporary positions, respectively.

2. A processing apparatus comprising a processing chamber defining a processing hollow space, means coupled to said processing hollow space for processing a sheet-like unprocessed substrate to provide a processed substrate, an inlet chamber defining an inlet hollow space, a first cassette member for holding a stack of unprocessed substrates in said inlet hollow space with each unprocessed substrate kept substantially parallel, means for transferring one substrate from said stack at a time into said processing chamber, an outlet chamber defining an outlet hollow space, means for transferring the processed substrate from said processing hollow space into said outlet hollow space, a second cassette member for receiving the transferred substrate in said outlet hollow space as a stack of processed substrates with each processed substrate kept substantially parallel, wherein the improvement comprises moving means coupled to at least a selected one of said first and said second cassette members for reversibly moving the selected cassette member between a home position and a temporary position, said selected cassette member holding the substrates with each substrate kept substantially horizontal and vertical when moved to said home and said temporary positions, respectively; said selected cassette member comprising a cassette for holding the stack of substrates and having a specific point not lower than the center of gravity of the selected cassette member moved to said home position together with the stack of substrates, wherein:

said selected cassette member further comprises first and second substantially horizontally aligned rod members fixed to said cassette above said specific point when said selected cassette member is moved to said home position;

said moving means comprising:

driving means for reversibly vertically driving said first and said second rod members; and a limitation bar horizontally protruded so that said first rod member is urged against said limitation bar while it is driven upwardly by said driving means;

said selected cassette member being put into and out of said temporary position when said first rod member is driven upwardly into contact with said limitation bar and downwardly out of contact with said limitation bar, respectively.

3. A processing apparatus as claimed in claim 2, wherein said first rod member comprises:

a horizontal rod having a first and a second end and fixed at said first end to said cassette in alignment with said second rod member; and an arm extended perpendicularly from said second end in a horizontal plane when said selected cassette member is put in said home position;

said arm being urged to said limitation bar while said first and said second rod members are moved upwards by said driving means.

4. A processing apparatus as claimed in claim 3, wherein said driving means comprises:

holding means for rotatably holding said rod and said second rod member; and guide means for guiding said holding means for vertical movement of said holding means.

5. A processing apparatus as claimed in claim 4, wherein said guide comprises:

a threaded rod vertically extended transversely of said limitation bar; and means for rotating said threaded rod;

said holding means having a threaded inside surface engaged with said threaded rod.

* * * * *